(12) United States Patent
Muthukumar et al.

(10) Patent No.: US 7,400,041 B2
(45) Date of Patent: Jul. 15, 2008

(54) COMPLIANT MULTI-COMPOSITION INTERCONNECTS

(76) Inventors: Sriram Muthukumar, 3600 W. Ray Rd., Apt. #2066, Chandler, AZ (US) 85226; Thomas S. Dory, 832 W. Rawhide Ave., Gilbert, AZ (US) 85233

( * ) Notice: Subject to any disclaimer, the term of this patent is extended or adjusted under 35 U.S.C. 154(b) by 113 days.

(21) Appl. No.: 10/832,178

(22) Filed: Apr. 26, 2004

(65) Prior Publication Data
US 2005/0239275 A1 Oct. 27, 2005

(51) Int. Cl.
*H01L 23/48* (2006.01)
(52) U.S. Cl. ............... 257/750; 257/748; 257/773; 257/785; 257/E23.021; 438/381; 438/611
(58) Field of Classification Search ......... 257/678, 257/748, 750, 785, E23.024; 439/66; 438/611
See application file for complete search history.

(56) References Cited

U.S. PATENT DOCUMENTS

| | | | |
|---|---|---|---|
| 3,842,189 A * | 10/1974 | Southgate | 174/52.3 |
| 4,642,889 A | 2/1987 | Grabbe | |
| 5,796,417 A | 8/1998 | Nobel | |
| 5,944,537 A * | 8/1999 | Smith et al. | 439/81 |
| 6,068,669 A | 5/2000 | Farnworth et al. | |
| 6,265,245 B1 | 7/2001 | Farnworth et al. | |
| 6,524,115 B1 | 2/2003 | Gates et al. | |
| 6,528,349 B1 * | 3/2003 | Patel et al. | 438/117 |
| 6,674,297 B1 | 1/2004 | Florence, Jr. et al. | |
| 7,244,125 B2 * | 7/2007 | Brown et al. | 439/66 |
| 2002/0171133 A1 * | 11/2002 | Mok et al. | 257/678 |
| 2003/0003779 A1 * | 1/2003 | Rathburn | 439/66 |
| 2003/0099097 A1 * | 5/2003 | Mok et al. | 361/767 |
| 2003/0103338 A1 * | 6/2003 | Vandentop et al. | 361/767 |

* cited by examiner

*Primary Examiner*—Howard Weiss
*Assistant Examiner*—John C Ingham
(74) *Attorney, Agent, or Firm*—Schwabe Williamson & Wyatt

(57) ABSTRACT

A compliant interconnect with two or more layers of metal of two or more compositions with internal stresses is described herein.

11 Claims, 4 Drawing Sheets

DEPOSITION AND PATTERNING OF THICK METAL LAYER,
FOR (1) METAL TRACE LINES, (2) BONDING PADS ~ 201

DEPOSITION OF THICK LAYER OF PHOTORESIST ~ 202

PATTERING OF THICK LAYER OF PHOTORESIST TO
CREATE POLYMER COLUMN ~ 203

BAKING SUBSTRATE TO REFLOW POLYMER COLUMN TO
CREATE POLYMER DOME ~ 204

COMPLIANT MULTI-COMPOSITION INTERCONNECTS

TECHNICAL FIELD & BACKGROUND

The present invention is related to the fields of electronics and Microelectromechanical Systems (MEMS). In particular, the present invention is related to electrical packaging of integrated circuits, circuit boards, electrode arrays, or other devices with compliant interconnects.

In ultra low k-ILD (interlayer dielectric) technology, the stress on the ILD layers should be minimized. Compliant interconnects with the modulated compliance to minimize the effects of mechanical and thermal stress on the ultra low-k ILD layers while still providing sufficient load bearing capability are desired.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a compliant interconnects comprising of two or more layers of metal deposited on each other with the metal consisting of two or more compositions and method for making the same.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
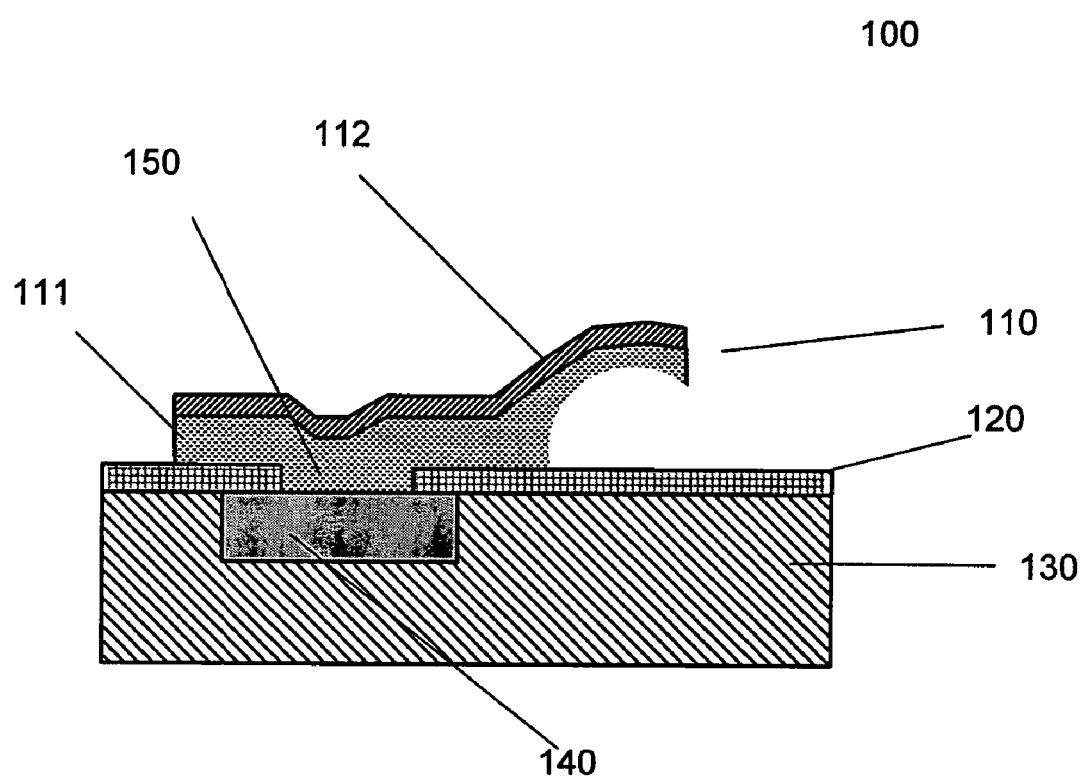
FIG. 1 illustrates a cross sectional view of a portion of a component with compliant interconnect with built in stressed metal layers, in accordance with one embodiment.
Figure 2A:
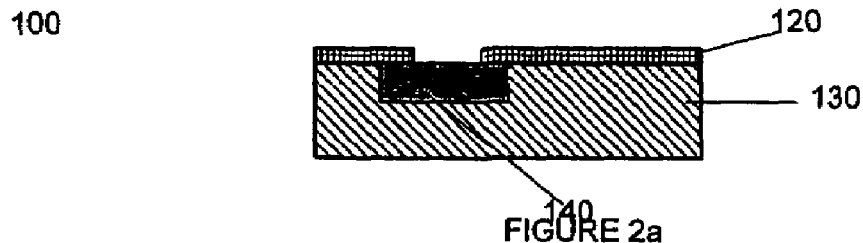
FIGS. 2a-2h illustrate a method for making the compliant interconnect of FIG. 1, in accordance with one embodiment.
Figure 2B:
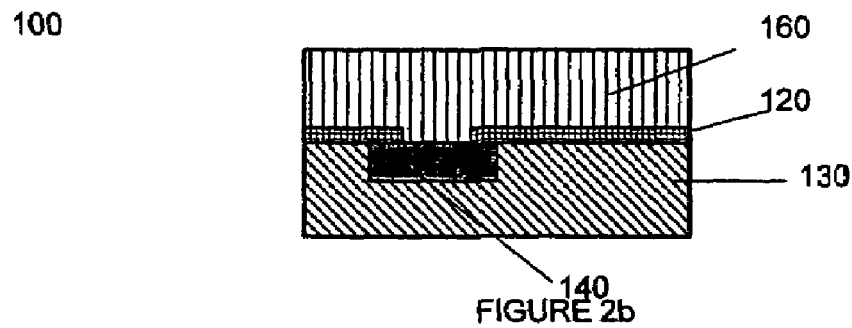
Figure 2C:
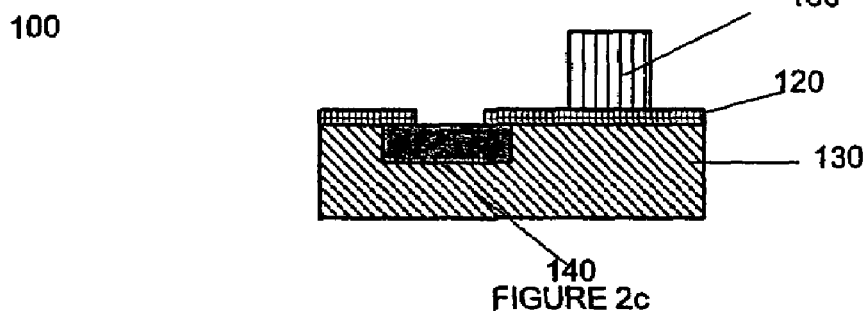
Figure 2D:
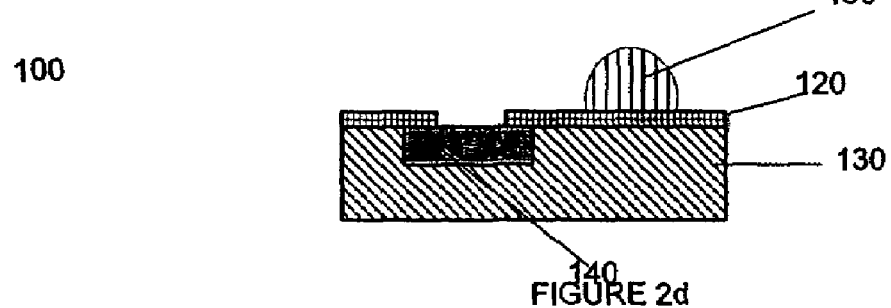
Figure 2E:
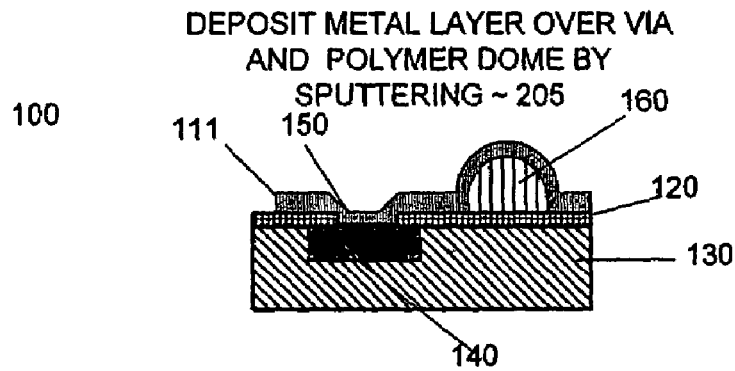
Figure 2F:
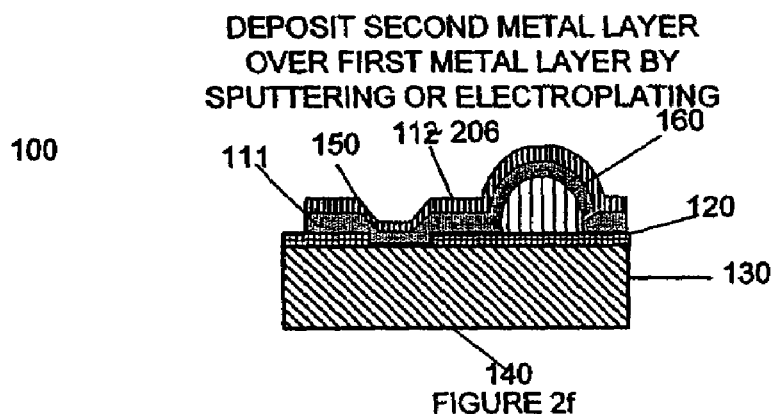
Figure 2G:
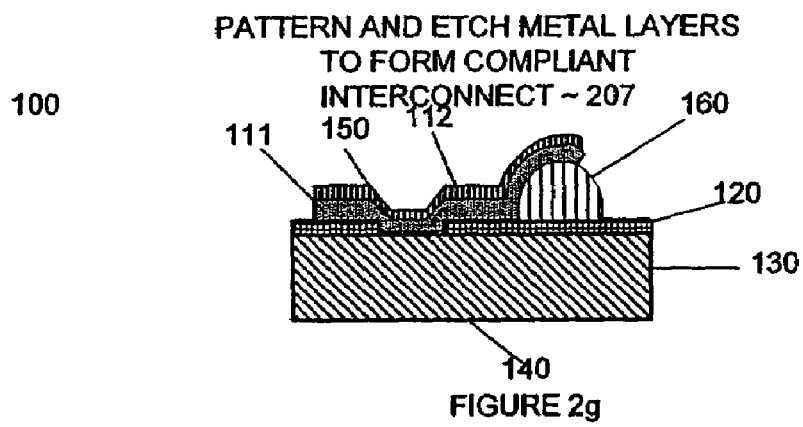
Figure 2H:
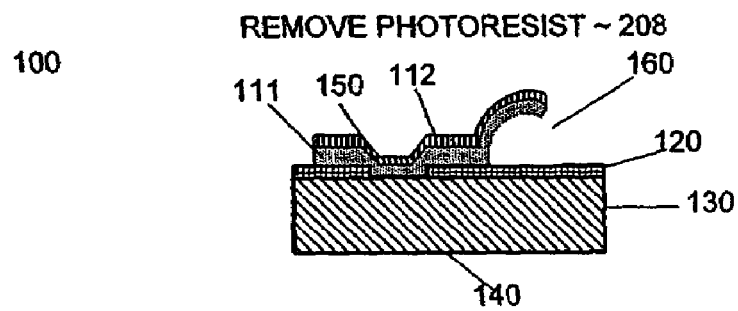

Referring now to FIG. 1, wherein a cross sectional view of a portion of a compliant interconnect in accordance with one embodiment, in the context of a component, is shown. As illustrated, for the embodiment, component 100 includes a metal pad 140. Further, component 100 includes a passivation layer (or dielectric layer) 120 disposed on a substrate 130 with an opening 150 exposing the pad and compliant interconnect 110 is electrically coupled to pad 140.

As will be described in more detail below, compliant interconnect 110 includes two or more metal layers of two or more metal compositions deposited upon each other with built in internal stresses. Resultantly, by varying the number of metal layers, the compositions of the metal layers, and/or the order of the metal layers, the compliance, compressive and tensile stress of the compliant interconnect may be controlled to a much greater degree, especially when contrasted with compliant interconnects created using a single metal composition. This improves stress reliability of the compliant interconnect.

The metal layers comprising the compliant interconnect 110 are deposited in a particular order of varying material composition, deposition conditions and thickness so as to vary the total stiffness, compliance and internal stresses in the compliant interconnect 110. The thickness, composition of material and the order of the metal layers are arranged so that the electrical properties of the compliant interconnect 110, such as resistance and inductance, meet the needs of the system where the compliant interconnect is used.

For ease of understanding, two metal layers 111 and 112 are illustrated for the embodiment of FIG. 1, each of metal layers 111, 112 may be formed employing a metal such as aluminum (Al) copper (Cu), titanium (Ti), nickel (Ni), gold (Au), silver (Ag), tin (Sn), tantalum (Ta), molybdenum (Mo), chromium (Cr), cobalt (Co), or other materials with like properties and alloys of these materials. The two metal layers 111-112 may be constituted with different metals.

The thickness of each layer is application dependent, depending on factors such as the composition of the metal, the compliance or stiffness sought, the resistance desired, and/or the inductance desired.

It should be noted that while for ease of understanding, only two metal layers 111-112 are shown in FIG. 1, in alternate embodiments, interconnect 110 may consist of two or more metal layers.

FIGS. 2a-2h illustrate a method of making component 100 in accordance with one embodiment. For the embodiment, substrate 130 with pad 140 and an opening exposing the pad 140 may be formed in any one of a number of techniques, op 201. In various embodiments, substrate 130 may be a silicon (Si) substrate, and passivation layer 120 may be formed employing silicon nitride (SiN), and deposited in any one of a number of techniques. In other embodiments, layer 120 may have a polyimide layer 130 The materials listed for the passivation layer 120 are illustrative only; any number of suitable materials may alternately be used to form the layer.

Then, photoresist 160 is deposited on a top side of dielectric layer 120, op 202.

Next, photoresist 160 is patterned to create a polymer column 160, op 203.

Then, polymer column 160 may be reflowed into polymer dome 160 in a number of application dependent manners, op 204. The temperature and the amount of time heat applied is dependent on the composition of the polymer, the size of column, and heat sensitive, if any, of the surrounding structures.

Next, a layer of metal 111 is deposited on the dielectric layer 120 over the opening 150 and the polymer dome 160, op 205. In various embodiments, metal layer 111 is deposited on by sputtering.

Then, an additional layer of metal 112 is deposited on the metal of layer 111, op 206. In other embodiments, compliant interconnect 110 may have more than two layers of metal. In various embodiments, metal layer 112 is deposited on by sputtering. In other embodiments, metal layer 112 is deposited on by electroplating.

Thereafter, compliant interconnect 110 is formed on top of a portion of dielectric layer 120, by patterning and etching, op 207.

Finally, the photoresist and polymer dome 160 are stripped leaving compliant interconnect 110, op 208.

Figure 3:
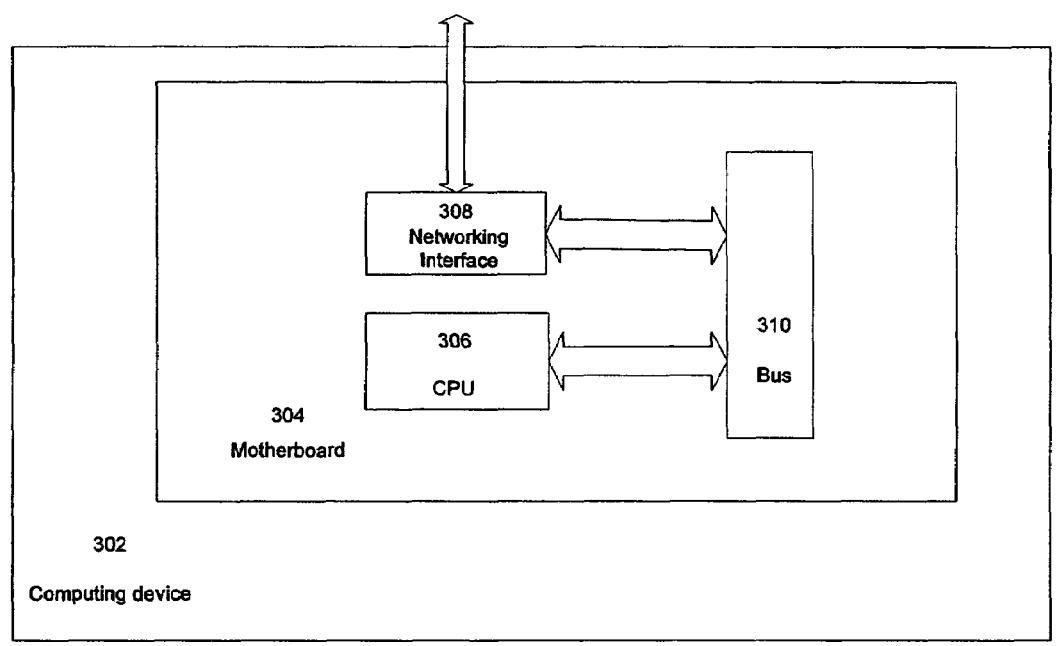
FIG. 3 illustrates a system having the component of FIG. 1 in accordance with one embodiment.

FIG. 3 illustrates a system in accordance with one embodiment. As illustrated, for the embodiment, system 300 includes computing device 302 for processing data. Computing device includes a motherboard 304. Motherboard 304 includes in particular a central processing unit 306, a networking interface 308 coupled to a bus 310. More specifically, central processing unit 306 is component 100 endowed with compliant interconnects.

Depending on the applications, system 300 may include other components, including but are not limited to a bus, volatile and non-volatile memory, a microprocessor, a chipset, mass storage (such as hard disk, compact disk (CD), digital versatile disk (DVD) and so forth), and so forth.

In various embodiments, system 300 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Thus, it can be seen from the above descriptions, a novel component having a compliant interconnect, method for making such a component, and a system having such a component have been described. While the present invention has been described in terms of the foregoing embodiments, those skilled in the art will recognize that the invention is not limited to the embodiments described. The present invention can be practiced with modification and alteration within the spirit and scope of the appended claims.

Therefore, the description is to be regarded as illustrative instead of restrictive on the present invention.

What is claimed is:

1. A compliant interconnect comprising:
   a first metal layer of a first metal composition having a first thickness and a first amount of internal stress;
   a second metal layer of a second metal composition, stacked on top of the first metal layer, the second metal layer having a second thickness and a second amount of internal stress, the second amount of internal stress being different from the first amount of internal stress, and wherein the second internal stresses is compressive stress; and
   the compliant interconnect having a concave shape with the first metal layer being on a concave side therof, the first amount of internal stress being of a greater compressive value relative to that of the second amount of internal stress.

2. The compliant interconnect of claim 1, wherein at least a selected one of the first and second metal composition comprises a selected one of (Al, Cu, Ti, Ni, Au, Ag, Sn, Ta, Mo, Cr and Co).

3. The compliant interconnect of claim 1, further comprising a third layer having third amount of internal stress being different from at least one of the first and second amounts of internal stress.

4. A system comprising:
   a component having;
      a substrate including a metal pad;
      a passivation layer disposed on the substrate, including an opening exposing the metal pad;
      a compliant interconnect disposed on a portion of the or passivation layer and the metal pad, the compliant interconnect having at least a first metal layer of a first metal composition with a first thickness and having a first amount of internal stress, and a second metal layer of a second metal composition, stacked on top of the first layer, with a second thickness and having a second amount of internal stress, wherin the second amount of internal stress is different from the first amount of internal stress, the second internal stress is a compressive stress, and the compliant interconnect having a concave shape with the first metal layer being on a concave side therof, the first amount of internal stress being of a relatively greater compressive value than that the second amount of internal stress;
   a bus coupled to the component; and
   a networking interface coupled to the bus.

5. The system of claim 4, wherein the component is a selected one of a microprocessor and a chipset.

6. The system of claim 4, wherein at least a selected one of the first and second metal composition of the compliant interconnect of the component comprises a selected one of (Al, Cu, Ti, Ni, Au, Ag, Sn, Ta, Mo, Cr and Co).

7. The system of claim 4, wherein said system is selected from the group comprising of a mobile phone, a DVD player, a digital camera, and a set-top box.

8. An apparatus comprising:
   a substrate including a metal pad;
   a passivation layer disposed on said substrate, including an opening exposing the metal pad;
   a polymer dome formed on said dielectric layer at one side of said opening; and
   a compliant interconnect disposed on a portion of said substrate and on said metal pad and on at least a portion of said polymer dome, the compliant interconnect having:
      a first metal layer of a first metal composition with a first thickness and having a first amount of internal stress; and
      a second metal layer of a second metal composition stacked on top of the first layer, with a second thickness and having a second amount of internal stress.

9. The apparatus of claim 8, wherein at least a selected one of the first and second internal stresses of the first and second metal layers of the compliant interconnect is compressive stress.

10. The apparatus of claim 8, wherein at least a selected one of the first and second internal stresses of the first and second metal layers of the compliant interconnect is tensile stress.

11. The apparatus of claim 8, wherein the apparatus is a microprocessor.

* * * * *

UNITED STATES PATENT AND TRADEMARK OFFICE
CERTIFICATE OF CORRECTION

PATENT NO. : 7,400,041 B2  Page 1 of 1
APPLICATION NO. : 10/832178
DATED : July 15, 2008
INVENTOR(S) : Sriram Muthukumar et al.

It is certified that error appears in the above-identified patent and that said Letters Patent is hereby corrected as shown below:

In the Claims:

Col. 3, line 52 "...the second internal stresses is"..." should read --...the second internal stress is...--;

Col. 4, lines 10-11, "...a compliant...of the or passivation layer..." should read --...of the passivation layer...--;

Col. 4, line 22, "...a compliant...side therof,..." should read --...side thereof...--.

Signed and Sealed this

Seventh Day of October, 2008

JON W. DUDAS
*Director of the United States Patent and Trademark Office*